United States Patent [19]

Scholz

[11] 4,143,245
[45] Mar. 6, 1979

[54] CONSTANT DISTORTION VOLUME CONTROL

[76] Inventor: Donald T. Scholz, 13 Rich Valley Rd., Wayland, Mass. 01778

[21] Appl. No.: 883,145

[22] Filed: Mar. 3, 1978

[51] Int. Cl.² .............................................. H03G 9/00
[52] U.S. Cl. ................................................. 179/1 VL
[58] Field of Search .................... 179/1 VL, 1 A, 1 E

[56] References Cited

PUBLICATIONS

H. Tremain, *The Audio Cyclopedia*, H. Sams Co., 1969, pp. 1136, 1144.

*Primary Examiner*—William C. Cooper
*Assistant Examiner*—E. S. Kemeny
*Attorney, Agent, or Firm*—Wolf, Greenfield & Sacks

[57] ABSTRACT

A device for maintaining a constant distortion output from a musical instrument amplifier over a volume range of the musical system. The amplifier is set at a predesired volume setting and volume control is provided by a potentiometer control interposed between the output of the amplifier which may, for example, be a guitar amplifier, and the loudspeaker. The potentiometer is connected so that one end is in series with the speaker providing the primary means for controlling volume while the other end is in parallel with the speaker. Because the load that the amplifier sees is a function of both the speaker impedance and the potentiometer setting, there is a calibration scale associated with the control dial of the potentiometer so that the amplifier output impedance can be matched to the impedance of the speaker being used.

7 Claims, 6 Drawing Figures

CONSTANT DISTORTION VOLUME CONTROL

BACKGROUND OF THE INVENTION

The present invention relates in general to a musical amplifier and speaker system, and pertains, more particularly, to a volume control device associated with the system for maintaining a constant distortion output over the normal volume range of the system. In accordance with the invention the device is for preserving the same quality of distortion at all output levels of the amplifier and speaker system.

Some amplifier systems are constructed to minimize distortion. However, modern music seeks to inject distortion into the musical tones with the distortion being considered as part of the musical composition. With modern music systems, the nature and quality of the distortion is created by the amplifier itself. However, one of the difficulties with an existing system is that the nature, character, quality and sound of the distortion changes with different amplifier output levels. At a high gain level, the distortion has a different quality than at a low gain level. When one simply turns up the volume of the amplifier there is a change in the quality of the distortion, and similarly there is a change when the gain of the amplifier is reduced. This is an undesirable characteristic of existing systems wherein the distortion changes with volume.

Accordingly, one object of the present invention is to provide an amplifier and speaker system wherein the distortion is maintained substantially constant over the output volume range of the system.

Another object of the present invention is to provide an indicator scale in association with the device of this invention indicating to the user of the system the appropriate impedance match between amplifier and speaker.

SUMMARY OF THE INVENTION

To accomplish the foregoing and other objects of this invention there is provided a volume control device for an amplifier and speaker system, which device is coupled between the amplifier and speaker for controlling the output volume level of the system while maintaining substantially constant distortion from the amplifier. The volume control device comprises a variable impedance means having a first part in series with the speaker and a second part in parallel with the speaker and further comprising a manual control means for controlling the impedance means to alter the first and second parts in a complementary manner so that as the first part impedance increases the second part impedance concurrently decreases and vice versa. The total impedance across the variable impedance means is maintained constant.

In the preferred embodiment of the present invention the device comprises a variable resistor or potentiometer intercoupled between the amplifier and speaker with one part of the potentiometer in series with the speaker and another part in parallel with the speaker. In the embodiment disclosed hereinafter a 15 ohm potentiometer is used. The volume of sound from the speaker is controlled by the setting of the potentiometer and is a function of the series resistance and the resistance in parallel with the speaker. The parallel resistance functions as a variable attenuator of volume particularly at its lower resistance setting which occurs when the series resistance is at its higher relative resistance. Thus, the potentiometer setting affects volume via both legs thereof. When the series resistance is at the maximum setting (parallel leg at minimum setting) the speaker is effectively cut-out. Alternatively, the full power from the amplifier (at that particular amplifier gain setting) is applied to the speaker and the parallel leg when the potentiometer is at its minimum series resistance position (parallel leg at maximum setting). However, throughout the entire range of the potentiometer settings, the signal applied to the speaker is of the same quality insofar as distortion is concerned. Thus, the output sound level of the speaker may be varied but without varying the distortion quality of the sound from the system.

With the inclusion of the volume control of this invention coupled between the amplifier and speaker, the load which the amplifier sees is a function of both the potentiometer setting and the particular speaker impedance. The load may vary from a maximum equal to or greater than the value of the potentiometer resistance, to a minimum on the order of 4 ohms or less. This load that the amplifier sees at its output depends both on the setting of the potentiometer and the impedance of the speaker and thus the load is a function of the volume setting that is chosen. The amplifier is preferably provided with a number of output taps or a tap switch for matching to a 4 ohm, 8 ohm or 16 ohm speaker and with the use of the volume control of this invention it is desired that the output impedance of the amplifier be closely coupled to the load which the amplifier drives in order for there to be maximum efficiency in power transfer from the amplifier to the speaker as well as to insure that neither the speaker nor amplifier are damaged by overloading because of any mismatching. Thus, in accordance with the invention, the volume control device includes a calibration scale which is associated with the control knob for the potentiometer. The scale includes three concentric circular bands, each of the bands intended to correspond to a particular one of the typical 4, 8, or 16 ohm speakers. Each of the bands is subdivided into arcuate segments which provide an indication from the pointer on the potentiometer knob as to what the impedance load of the speaker circuit is. Thus, for a particular impedance speaker and for a particular volume setting, the user can set the switch on the back of the amplifier to correspond to the proper load actually seen by the amplifier thus providing proper matching and reducing the chance of damage to the amplifier or speaker.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

Figure 1:
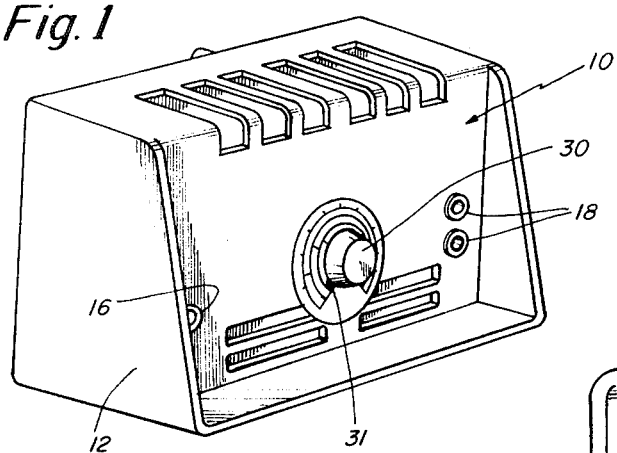
FIG. 1 is a perspective view of the volume control device of the present invention.
Figure 2:
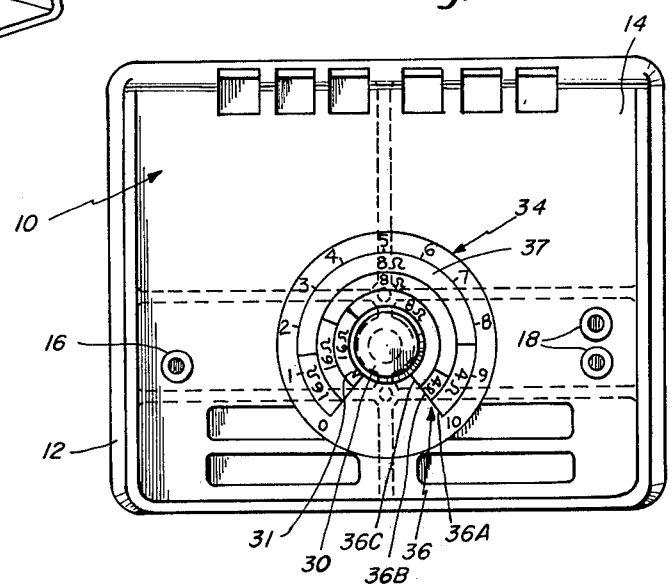
FIG. 2 is a front elevation view of the device shown in FIG. 1.
Figure 3:
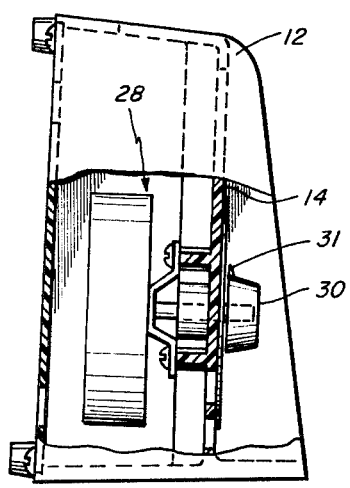
FIG. 3 is a side elevation view of the device shown in FIG. 1.
Figure 4:
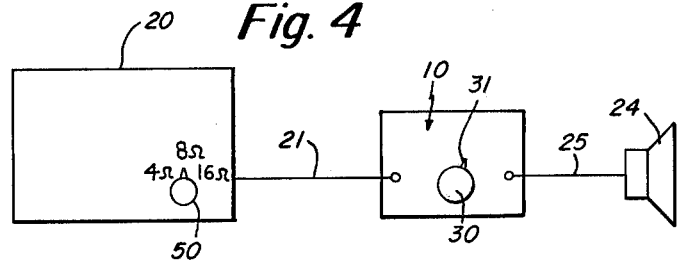
FIG. 4 is a schematic diagram showing the control device of FIGS. 1 and 2 in an amplifier and speaker system.

FIGS. 1-3 show one embodiment of the volume control device 10. This device comprises a housing 12 having side walls, a top wall, a bottom wall, and a back wall. The top has a series of open vents to permit heat transfer away from the device. The housing 12 also has a front wall 14 for supporting an input receptacle 16 and a pair of output receptacles 18. The receptacle 16 receives a connecting cable from the amplifier and the output receptacles 18 receive one or more cables for connecting to one or more speakers associated with the musical system. FIG. 4 shows the amplifier 20 with a cable 21 connecting to the volume control device 10, and also a speaker 24 connecting by means of cable 25 to the device 10.

A potentiometer 28 is mounted within the housing 12 from the front wall 14. This mounting may be accomplished in a conventional manner. The potentiometer 28 has a control knob 30 extending through the wall 14 and has associated therewith a pointer 31 which is in turn usable with the volume scale 34 and the calibration scale 36 discussed in more detail hereinafter.

When the device 10 of this invention is employed, the amplifier 20 is preferably set at a predetermined output gain and it is left at that particular setting. In this way, the volume of the system is not controlled by the volume control on the amplifier, but is instead preferably totally controlled by the volume control device 10. In this way, the output distortion from the amplifier 20 is maintained constant and the device 10, being purely resistive, effects only volume and does not alter the distortion from the amplifier.

Figure 5:
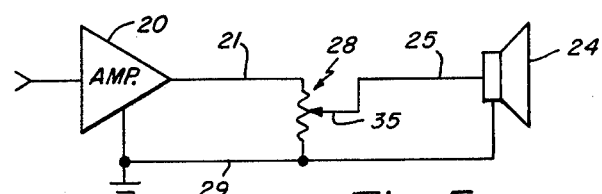
FIG. 5 shows a version of the invention employing a potentiometer for volume control.
Figure 6:
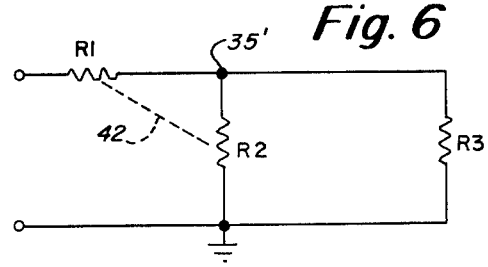
FIG. 6 depicts an equivalent circuit for the volume control device and speaker.

FIG. 5 shows the connection of the potentiometer 28 between the amplifier 20 and the speaker 24. The two fixed ends of the potentiometer 28 couple to line 21 and the common line 29. The wiper arm 35 of the potentiometer 28 couples by way of cable 25 to the speaker 24. FIG. 6 shows the equivalent circuit with a portion of the potentiometer being depicted by the series resistor R1 and the other portion of the potentiometer being depicted by the parallel resistor R2. In FIG. 6 the speaker is depicted by the resistor RS and the wiper arm is depicted by the node 35'. FIG. 6 also shows the dotted line 42 depicting the common complementary control between the values of the resistors R1 and R2 as the knob is turned to move the wiper arm 35 along the potentiometer. The values of the resistors R1 and R2 are always the same total value which in the preferred embodiment is a total resistance of 15 ohms. However, by control of the knob 30 the specific values of each of the resistive parts R1 and R2 changes. For example, at a mid-setting of the knob 30 the resistor values are equal each to 7.5 ohms.

The volume of the sound generated by the speaker is controlled by the combination resistor R1 which is in series with the speaker and reisistor R2 which is in parallel with the speaker operating together in a complementing fashion. The speaker may be reduced to zero volume by having the entire resistance in series therewith so that the resistor R1 is approximately 15 ohms and the resistor R2 is approximately 0 ohms. On the other hand, the full power from the amplifier at a predetermined amplifier gain setting can be applied to the speaker and the resistor R2 by setting the potentiometer so that the series resistance R1 is at a minimum or very small resistance, even as low as zero ohms. Throughout the entire range of the potentiometer, the signal applied to the speaker is of the same quality insofar as distortion is concerned. Thus, the output sound level of the speaker may be varied but without varying the distortion quality from the amplifier 20.

As previously indicated, the load that the amplifier drives depends both upon the setting of the potentiometer and the impedance of the speaker. Thus, the load that the amplifier drives will vary with variations in the volume that is selected by the knob 30. In order to assure a proper match to the particular speaker that is used the calibration scale 36 is employed in association with the pointer 31 of the control knob. The calibration scale 36 includes three concentric circular bands 36A, 36B, and 36C which correspond, respectively, with 4 ohm, 8 ohm and 16 ohm speakers that are used with the system. Each of the bands is further subdivided into arcuate segments 37. In the drawing, each of the segments 37 is identified by a 4 ohm, 8 ohm or 16 ohm designation corresponding to the proper setting that is to be selected by the tap switch 50 depicted schematically in FIG. 4. The bands 36A and 36B include all three impedance positions while the band 36C includes only the settings for 8 ohms and 16 ohms.

For example, the 4 ohm speaker band 36A is divided into three segments 37 and depending upon the position of the knob 30, the user is able to determine the proper setting of the switch 50 by reference to the particular segment 37 that is being pointed out. Thus, at the lower volume settings of the potentiometer the resistor R1 may, for example, be 11 ohms and the resistor R2 is 4 ohms. In this example, the speaker impedance is also 4 ohms and thus the parallel combination of resistors R2 and RS provide a total impedance of 2 ohms which in series with the impedance of resistor R1 provides a total impedance seen by the amplifier of 13 ohms. For that particular impedance, the pointer 31 points to the 16 ohm segment 37 because that setting of the switch 50 is the closest to the total impedance seen by the amplifier. As the volume is increased, the load seen by the amplifier decreases and at a predetermined point the pointer will then be disposed in the relatively wide 8 ohm segment 37. It should be noted that as the volume is increased the effective circuit is one in which the first part of the potentiometer is in series and the second part is in parallel with the speaker. The effective resistance of the parallel speaker and second part of the potentiometer is less than either of them although it will have an additive effect to the series resistance R1. At the high volume end with a 4 ohm speaker, the resistor R1 may be 1 ohm and the series resistance of resistors R2 and RS may be on the order of 2-4 ohms thus making the total impedance on the order of 4 ohms. The drawing shows this 4 ohm segment of band 36A at the high volume end which indicates that the switch 50 should then be selected to the 4 ohm position. Thus, there is a correspondence between the setting of the switch 50 and the particular speaker used with regard to a 4 ohm speaker, only at the high volume setting.

With regard to the band 36B the operation is quite similar but it is noted that the segments are essentially shifted because of the higher impedance of the speaker that is now used. The band 36B corresponds to an 8 ohm speaker. For this band, at low volumes, the switch 50 is at its 16 ohm position and at very high volumes the switch 50 is at its 4 ohm position. At the midband volumes the switch 50 is at its 8 ohm setting corresponding to the impedance of the speaker.

The last band 36C has associated therewith only two segments corresponding to 8 ohm and 16 ohm positions of the switch 50. This band corresponds to a 16 ohm speaker that is used with the system. When the volume is turned all the way up, it is desirable to use the 8 ohm setting of the switch 50. At higher volumes the resistor R2 is greater than the resistor R1 and the total impedance is more nearly matched when the 8 ohm setting is used on the amplifier switch 50.

Having described one embodiment of the present invention, it should now be apparent to those skilled in the art, that numerous other embodiments are contemplated as falling within the scope of this invention. For example, a potentiometer has been shown as a preferred form of control device. However, it is understood that other impedance devices may be used having individual impedance parts as illustratively depicted by the resistors R1 and R2 of FIG. 5. Also, although conventional speaker impedances have been disclosed, it is understood that any other combination of speaker impedances may be employed and that the invention may be practiced with more or less than three calibration bands depending upon the number of different types of speakers that may be employed.

What is claimed is:

1. For an amplifier and speaker system, a volume control device coupled between the amplifier and speaker for controlling the output volume level of the system while maintaining substantially constant distortion from the amplifier, said volume control device comprising, a variable impedance means having a first part in series with the speaker and a second part across the speaker manual control means for controlling the impedance means to alter the first and second parts in a complementary manner and at least one calibration display means associated with the manual control means having at least two segments thereon for indicating proper impedance match between the amplifier and speaker depending upon the position of the manual control means.

2. A volume control device as set forth in claim 1 wherein said variable impedance means comprises a potentiometer and associated volume control knob.

3. A volume control device as set forth in claim 2 wherein said amplifier has a selector means for selecting one of a plurality of impedance levels, said control knob for indicating, by reference to the calibration display means segment, which position to be selected by the selector means.

4. A volume control device as set forth in claim 3 including a plurality of concentric calibration bands each corresponding to a different impedance speaker usable with the system.

5. A volume control device as set forth in claim 4 wherein some of said bands include three segments.

6. A volume control device as set forth in claim 2 wherein said segments each indicate an impedance value with the lower volume settings of the control knob corresponding to the higher impedance value.

7. A volume control device as set forth in claim 2 wherein said potentiometer has ends coupling across the output of the amplifier and a variable control arm controlled by the control knob coupled to the speaker whereby a first part impedance on one side of the arm is in series with the speaker and a second part impedance on the other side of the arm is in parallel with the speaker.

* * * * *